US009680055B2

(12) United States Patent
Jeon et al.

(10) Patent No.: US 9,680,055 B2
(45) Date of Patent: Jun. 13, 2017

(54) HETERO-SUBSTRATE, NITRIDE-BASED SEMICONDUCTOR LIGHT EMITTING DEVICE, AND METHOD FOR MANUFACTURING THE SAME

(71) Applicants: LG ELECTRONICS INC., Seoul (KR); LG SILTRON INCORPORATED, Gyeongsangbuk-do (KR)

(72) Inventors: Kiseong Jeon, Seoul (KR); Hojun Lee, Daegu (KR); Kyejin Lee, Gumi-si (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 14/067,171

(22) Filed: Oct. 30, 2013

(65) Prior Publication Data
US 2014/0124804 A1 May 8, 2014

(30) Foreign Application Priority Data

Nov. 2, 2012 (KR) .................. 10-2012-0123637

(51) Int. Cl.
*H01L 33/12* (2010.01)
*H01L 33/00* (2010.01)
*H01L 29/205* (2006.01)

(52) U.S. Cl.
CPC ............ *H01L 33/12* (2013.01); *H01L 29/205* (2013.01); *H01L 33/007* (2013.01)

(58) Field of Classification Search
CPC ..... H01L 33/12; H01L 33/007; H01L 33/002; H01L 29/205; H01L 32/12
See application file for complete search history.

(56) References Cited

U.S. PATENT DOCUMENTS

2003/0136333 A1* 7/2003 Semond et al. ................ 117/95
2006/0073621 A1* 4/2006 Kneissel ........... H01L 29/66462
438/21

(Continued)

FOREIGN PATENT DOCUMENTS

EP          1 211 736 A2   6/2002
JP          5023230 B1     9/2012

OTHER PUBLICATIONS

European Search Report dated Jan. 20, 2016, issued in Application No. 13190974.9.

*Primary Examiner* — Minh-Loan Tran
*Assistant Examiner* — Farid Khan
(74) *Attorney, Agent, or Firm* — KED & Associates LLP

(57) ABSTRACT

A hetero-substrate, a nitride-based semiconductor light emitting device, and a method of manufacturing the same are provided. The hetero-substrate may include a substrate including a silicon semiconductor, a buffer layer disposed on the substrate, a first semiconductor layer disposed on the buffer layer and including a nitride semiconductor, a second semiconductor layer disposed on the first semiconductor layer and including a first conductive type nitride semiconductor having a first doping concentration, and a stress control structure disposed between the first semiconductor layer and the second semiconductor layer and including at least one stress compensation layer and at least one third semiconductor layer including a first conductive type nitride semiconductor having a second doping concentration that is the same or lower than the first doping concentration.

14 Claims, 9 Drawing Sheets

(56) References Cited

U.S. PATENT DOCUMENTS

| | | | |
|---|---|---|---|
| 2006/0226442 A1* | 10/2006 | Zhang | H01L 29/7787 257/192 |
| 2010/0032718 A1* | 2/2010 | Yu et al. | 257/200 |
| 2010/0187496 A1* | 7/2010 | Yan | 257/13 |
| 2010/0289067 A1* | 11/2010 | Mishra | H01L 29/2003 257/268 |
| 2011/0303891 A1* | 12/2011 | Chua et al. | 257/13 |
| 2012/0001194 A1* | 1/2012 | Nakata | H01L 29/66462 257/76 |
| 2012/0223328 A1* | 9/2012 | Ikuta et al. | 257/76 |
| 2012/0292593 A1 | 11/2012 | Shioda et al. | |
| 2013/0026480 A1* | 1/2013 | Fenwick | H01L 21/02381 257/76 |
| 2013/0043488 A1* | 2/2013 | Miyoshi et al. | 257/76 |
| 2013/0307024 A1* | 11/2013 | Kokawa et al. | 257/190 |
| 2014/0048848 A1* | 2/2014 | Storck et al. | 257/190 |

\* cited by examiner

HETERO-SUBSTRATE, NITRIDE-BASED SEMICONDUCTOR LIGHT EMITTING DEVICE, AND METHOD FOR MANUFACTURING THE SAME

CROSS-REFERENCE TO RELATED APPLICATION

This application claims priority under 35 U.S.C. §119 to Korean Patent Application No. 10-2012-0123637, filed in Korea on Nov. 2, 2012, whose entire disclosure is hereby incorporated by reference.

BACKGROUND

1. Field

This relates to a light emitting device and a method of manufacturing the same.

2. Background

Light emitting devices such as light emitting diodes (LED) may be p-n junction diodes which convert electric energy into light and may realize a variety of colors by adjusting a composition ratio of compound semiconductors formed of a Group III element compound and a Group V element compound.

BRIEF DESCRIPTION OF THE DRAWINGS

The embodiments will be described in detail with reference to the following drawings in which like reference numerals refer to like elements wherein.

DETAILED DESCRIPTION

Hereinafter, embodiments will be described in detail with reference to the accompanying drawings. It may be understood that various modifications and variations and specific embodiments thereof are described with reference to the accompanying drawings and will be described in detail. However, embodiments are not limited to the exemplary embodiments set forth herein, and may include modifications, variations, equivalents, and substitutions compliant with the spirit or scope as broadly described herein.

It may be understood that when an element such as a layer, area, or substrate is referred to as being "on" another element, it may be directly on the element, or one or more intervening elements may also be present. It may also be understood that although terms such as "first" and "second" may be used herein to describe elements, components, areas, layers and/or regions, the elements, components, areas, layers and/or regions are not necessarily limited by these terms.

Nitride semiconductors may have relatively high thermal stability and wide bandgap energy, and thus may be effective in the field of optical devices and high-output electronic devices. For example, blue light emitting devices, green light emitting devices, ultraviolet light emitting devices, and the like, which use nitride semiconductors, may be particularly effective. Such light emitting devices using nitride semiconductors may be disposed on a hetero-substrate made of sapphire or silicon carbide (SiC). However, such silicon semiconductors may have different coefficients of thermal expansion and lattice constants than those of nitride semiconductors, and thus may be difficult to grow into a thick nitride semiconductor film, thus making it difficult to achieve improvements in conductivity by increasing an amount of a dopant.

Figure 1:
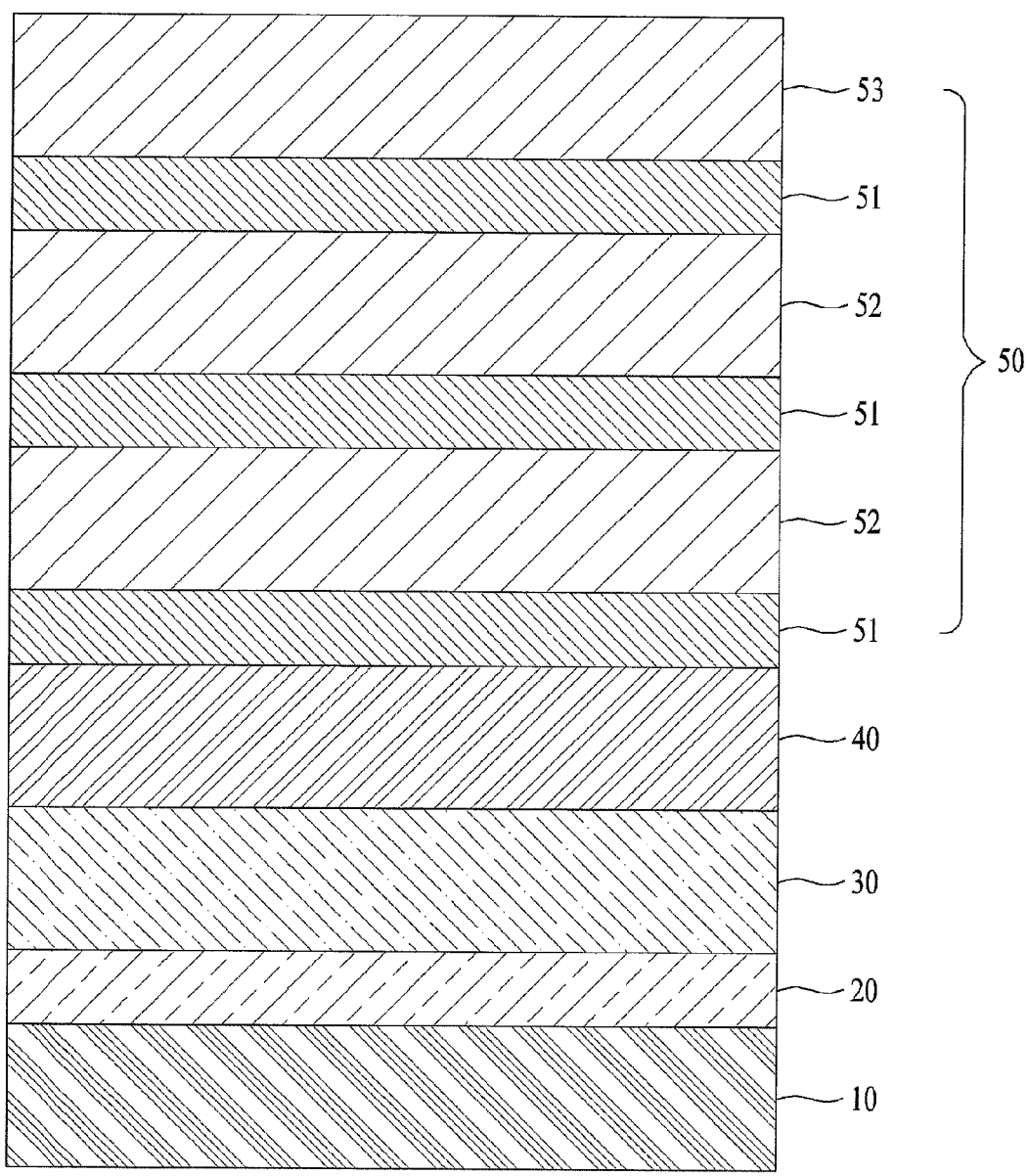
FIG. 1 is a sectional view of a hetero-substrate, according to an embodiment as broadly described herein.

As illustrated in FIG. 1, a hetero-substrate 100 as embodied and broadly described herein may include a substrate 10 including a silicon (Si) semiconductor, a buffer layer 30 disposed on the substrate 10, and a first semiconductor layer 40 disposed on the buffer layer 30 and including a nitride semiconductor.

The silicon semiconductor substrate 10 may be used in general semiconductor manufacturing processes, and may be used to fabricate large-scale wafers, and may have relatively high thermal conductivity.

The silicon semiconductor substrate 10 may have a (111)-plane orientation. A surface of the silicon semiconductor substrate 10 having the (111)-plane orientation may have a lattice constant of about 3.8403 Å. In contrast, a surface of the silicon semiconductor substrate 10 having a (100)-plane orientation may have a lattice constant of about 5.40 Å. Thus, given that gallium nitride (GaN) has a lattice constant of about 3.189 Å, that the silicon semiconductor substrate 10 may have the (111)-plane orientation.

The buffer layer 30 disposed on the silicon semiconductor substrate 10 may be formed of, for example, aluminum nitride (AlN) or aluminum gallium nitride (AlGaN).

When the buffer layer 30 is formed of AlGaN, the composition of Al included in the buffer layer 30 may decrease with increasing distance from the silicon semiconductor substrate 10, and, in certain embodiments, the Al composition may decrease linearly or may decrease stepwise. The Al composition may be between 0.1 and 0.9 with respect to Ga based on the thickness of the buffer layer 30, and in certain embodiments may be between 0.2 and 0.6. In addition, the buffer layer 30 may also have a uniform composition throughout the entire thickness thereof.

The buffer layer 30 may reduce crystal defects (mainly, dislocation defects) occurring due to lattice constant mismatch and differences in coefficient of thermal expansion between a gallium nitride (GaN) thin film and the silicon semiconductor substrate 10 in a process of forming a semiconductor thin film formed of a nitride such as GaN on the silicon semiconductor substrate 10, and may prevent occurrence of cracks in the GaN thin film by eliminating stress applied to the GaN thin film.

In certain embodiments, the buffer layer 30 may have a thickness between 100 nm and 1.5 μm.

A nucleation layer 20 may be disposed between the silicon semiconductor substrate 10 and the buffer layer 30. The nucleation layer 20 may be formed of AlN, may determine initial crystal growth conditions for forming the buffer layer 30, and may prevent Ga atoms included in a GaN layer from permeating into the substrate 10 due to a melt-back phenomenon.

In the embodiment shown in FIG. 1, the first semiconductor layer 40 including a nitride semiconductor is disposed on the above-described buffer layer 30, and may be formed of GaN, in particular, undoped GaN.

In some cases, the first semiconductor layer 40 may be doped and may have a lower doping concentration than that of a nitride semiconductor layer (a third semiconductor layer 52) included in a stress control structure 50 provided on the first semiconductor layer 40. In this regard, silicon (Si) may be used as a dopant, and the doping concentration may be 3×1018/cm3 or less.

A second semiconductor layer 53 including a first conductive type nitride semiconductor may be provided at an upper portion of the hetero-substrate 100. The second semiconductor layer 53 may have a first doping concentration.

The stress control structure 50 may include at least one stress compensation layer 51. At least one third semiconductor layer 52 including a first conductive type nitride semiconductor may be disposed between the first semiconductor layer 40 and the second semiconductor layer 53.

In certain embodiments, the first conductive type nitride semiconductor may be an n-type or p-type. Hereinafter, simply for ease of explanation an n-type will be described as the first conductive type.

In certain embodiments, the second semiconductor layer 53 may be a separate highly doped n-type semiconductor layer. Alternatively, the second semiconductor layer 53 may be an n-type semiconductor layer constituting a portion of a light emitting device.

In certain embodiments, the second semiconductor layer 53 may have a thickness of between 0.5 μm and 5 μm.

In certain embodiments, the stress compensation layer 51 of the stress control structure 50 may include AlN, and the third semiconductor layer 52 may include GaN. In certain embodiments, the stress compensation layer 51 may include AlGaN.

In certain embodiments, the stress control structure 50 may include a plurality of stress compensation layers 51 and a plurality of third semiconductor layers 52 that are alternately arranged. The stress compensation layers 51 and the third semiconductor layers 52 may be alternately formed, for example, up to six times, but are not necessarily limited thereto.

The stress compensation layer 51 may have a thickness of between 10 and 100 nm, and the third semiconductor layer 52 may have a thickness of between 30 nm and 1.5 μm.

The third semiconductor layer 52 may have a second doping concentration that is lower than the first doping concentration of the second semiconductor layer 53. That is, when the second semiconductor layer 53 is a different, highly doped, semiconductor layer than the stress control structure 50, the doping concentration of the second semiconductor layer 53 may be similar to that of an n-type semiconductor layer 200 (see FIG. 2). The doping concentration may be, for example, between 5×1018/cm3 and 2×1019/cm3.

In certain embodiments, a doping concentration, i.e., the second doping concentration, of the third semiconductor layer 52 may be between 15% and 90% with respect to the first doping concentration. In some cases, the doping concentration of the third semiconductor layers 52 may increase with increasing distance from the substrate 10. That is, the doping concentration of the third semiconductor layers 52 may increase as they approach the second semiconductor layer 53.

When a light emitting device is manufactured using the hetero-substrate 100, an n-type nitride semiconductor layer having a sufficient thickness of, for example, 3 μm or greater, and having an n-type dopant concentration of, for example, 5×1018/cm3 or greater may be used. Such an n-type nitride semiconductor layer having the above-described thickness and doping concentration may be grown on, for example, a sapphire or SiC substrate. However, it may be difficult to grow the n-type nitride semiconductor layer on a Si semiconductor substrate.

For example, cracking occurring in the growth process may present an obstacle. That is, when GaN is grown into a relatively thick film, cracks may occur due to differences in coefficients of thermal expansion and lattice constants between a silicon semiconductor and GaN.

In order for a light emitting device manufactured on the hetero-substrate 100 to perform satisfactorily, Si doping concentration of the nitride semiconductor included in the hetero-substrate 100 may be relatively high, i.e., between 4×1018/cm3 and 3×1019/cm3, and the thickness of the nitride semiconductor may be, for example, 1 μm or greater.

Due to differences in lattice constant and coefficient of thermal expansion of Si and GaN, it may be difficult to achieve a large thickness. In addition, as doping concentration increases, dopant-induced tensile stress may also increase, and thus cracking may occur due to tensile stress. Accordingly, increases in doping concentration may be somewhat limited.

However, in the hetero-substrate 100 having the above-described structure, a relatively thick n-type nitride semiconductor layer may be formed on the silicon semiconductor substrate 10 using a high-concentration dopant without occurrence of cracking. By using the hetero-substrate 100 described herein, cracking may be avoided, which may provide substantial advances in development of light emitting devices and electronic devices that are based on a silicon substrate.

Figure 2:
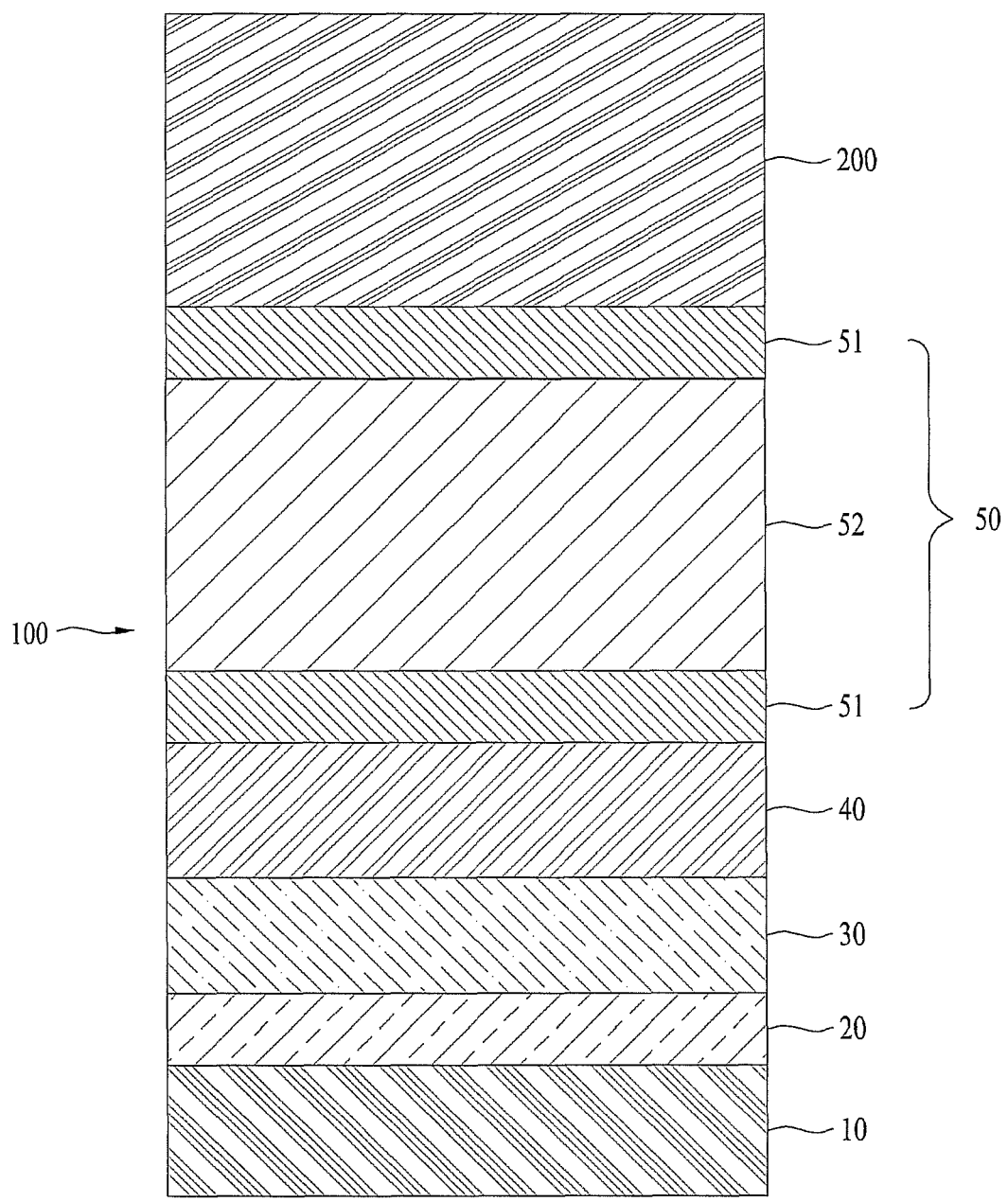
FIG. 2 is a sectional view of stress control effects of the hetero-substrate shown in FIG. 1.
Figure 3:
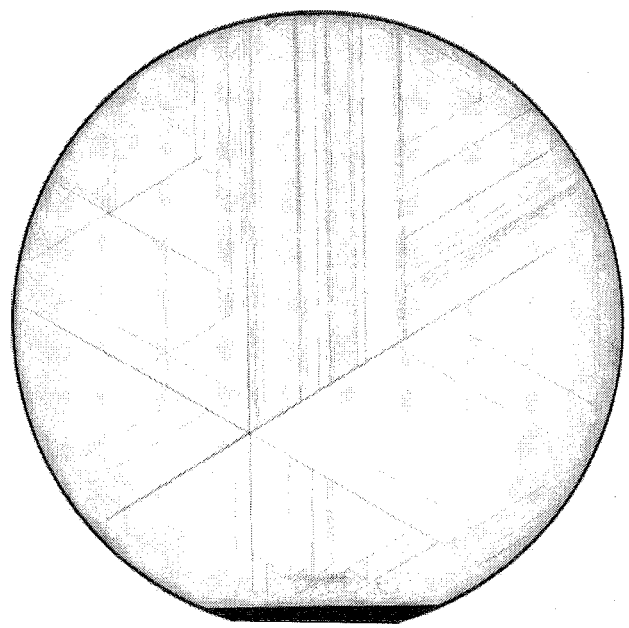
FIGS. 3 through 8 illustrate stress control effects shown in FIG. 2.
Figure 4:
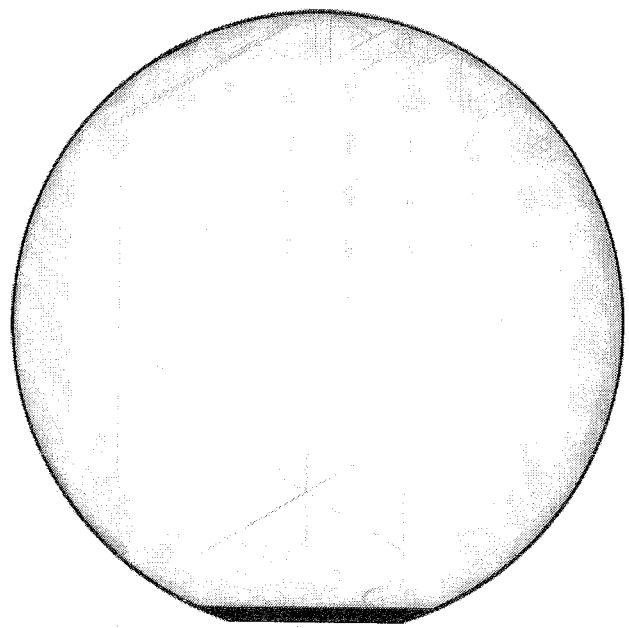
Figure 5:
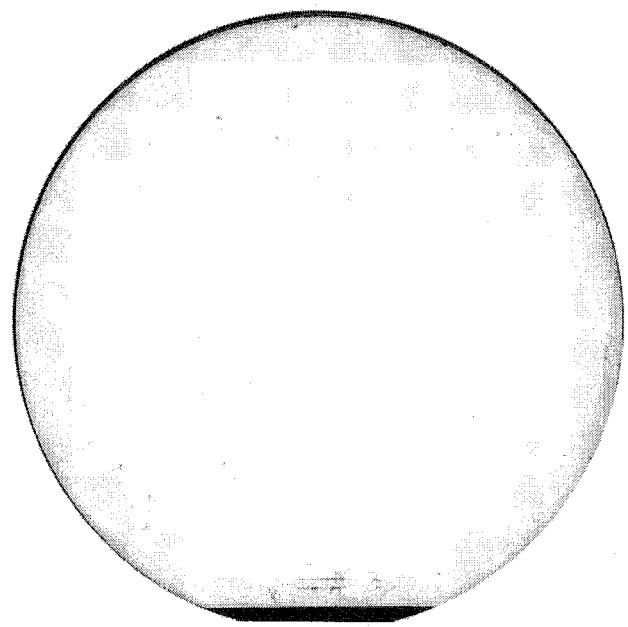
Figure 6:
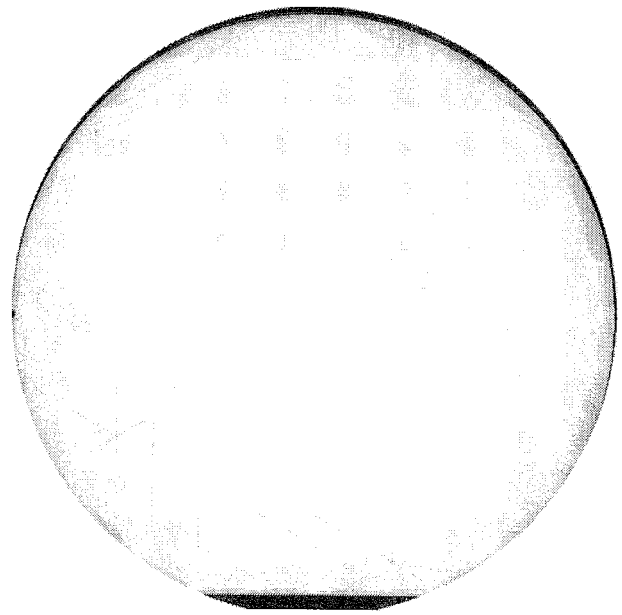
Figure 7:
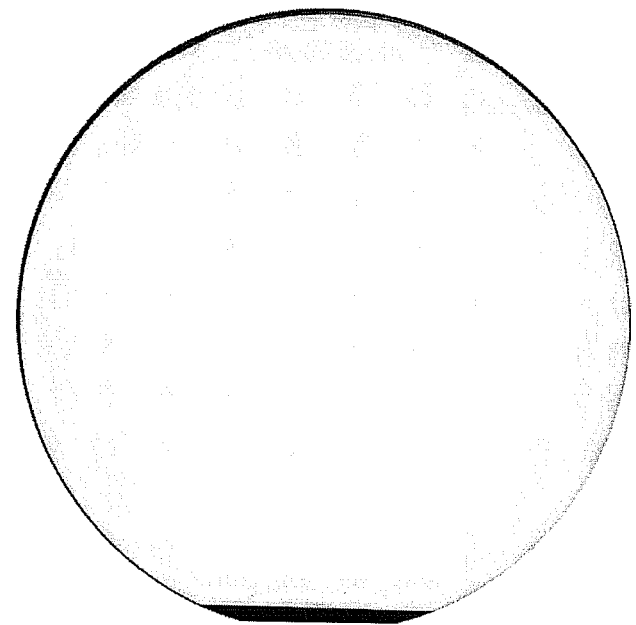
Figure 8:
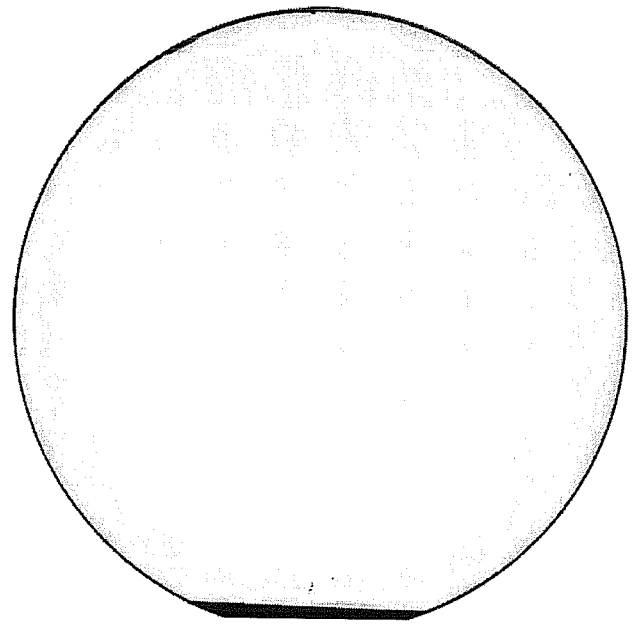

FIG. 2 illustrates a state in which an n-type semiconductor layer 200 is grown on the hetero-substrate 100. In one example, a GaN layer having a dopant (Si) concentration of 7×1018/cm3 and a thickness of 2 μm was grown on the hetero-substrate 100 by varying the doping concentration of the third semiconductor layer 52 of the stress control structure 50, as shown in Table 1. In this example, the third semiconductor layer 52 may include a Si dopant or undoped GaN.

That is, in an arrangement in which the n-type semiconductor layer 200 is disposed on the hetero-substrate 100 including the silicon semiconductor substrate 10, the nucleation layer 20, the buffer layer 30, the first semiconductor layer 40 and the stress control structure 50, cracking rates vary according to changes in doping concentration of the third semiconductor layer 52 included in the stress control structure 50, as shown in Table 1.

In Samples 1 through 6 shown in Table 1, the nucleation layer 20 used AlN, and the buffer layer 30 used AlGaN. The stress compensation layer 51 of the stress control structure 50 used AlN, and the first semiconductor layer 40 used undoped GaN.

TABLE 1

| Sample | Dopant (Si) concentration |
|---|---|
| 1 | Un-doped |
| 2 | $6.0 \times 10^{17}/cm^3$ |
| 3 | $1.2 \times 10^{18}/cm^3$ |
| 4 | $2.5 \times 10^{18}/cm^3$ |
| 5 | $3.7 \times 10^{18}/cm^3$ |
| 6 | $5.0 \times 10^{18}/cm^3$ |

FIGS. 3 through 8 illustrate occurrence of cracks in samples, respectively corresponding to Samples 1 through 6 shown in Table 1.

As shown in FIGS. 3 to 8, the lowest crack density was exhibited when the dopant concentration of the third semiconductor layer 52 was between the dopant concentration of the n-type semiconductor layer 200 and the dopant concentration of the first semiconductor layer 40. In addition, when the doping concentration exceeds the doping concentration of Sample 4, i.e., 2.5×1018/cm3, dopant concentration appears to have lithe influence upon cracking rate.

Thus, in certain embodiments, the dopant concentration of the third semiconductor layer 52 may be between 15% and 90% of the doping concentration of an n-type semiconductor layer (in some cases, the n-type semiconductor layer 200 constituting a portion of a light emitting device or the outermost layer 52 or 53 of the stress control structure 50) disposed on the hetero-substrate 100. As such, due to the stress control structure 50 including the third semiconductor layer 52 having a doping concentration varying with respect to an uppermost n-type semiconductor layer, occurrence of cracks in the GaN thin film may be prevented.

Figure 9:
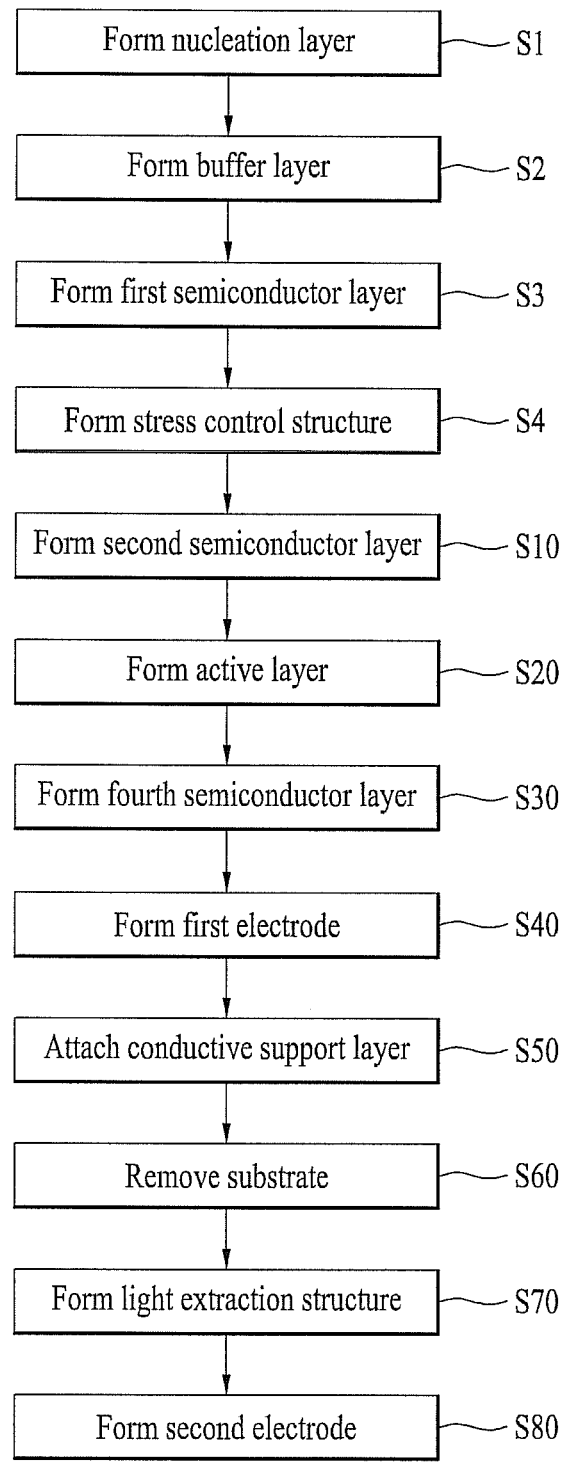
FIG. 9 is a flowchart of a method of manufacturing a hetero-substrate and a light emitting device, in accordance with embodiments as broadly described herein.

Hereinafter, a process of manufacturing the hetero-substrate 100 and a process of manufacturing a vertical type light emitting device using the hetero-substrate 100 will be described in detail with reference to FIG. 9.

First, chemical pretreatment may be performed on the silicon semiconductor substrate 10 having a (111)-plane orientation. That is, treatment, or washing, may first be performed to remove organic contaminants, fine particles, and the like present on an upper surface of the silicon semiconductor substrate 10.

Subsequently, a natural oxide film formed on the silicon semiconductor substrate 10 may then be removed using dilute HF.

Once chemical pretreatment of the silicon semiconductor substrate 10 is completed, the silicon semiconductor substrate 10 may be placed in a metal organic chemical vapor deposition (MOCVD) apparatus, and then a thermal cleaning process may be performed thereupon using hydrogen at a temperature between 1000 and 1200° C.

In addition to or instead of MOCVD, other methods, such as, for example, molecular beam epitaxy (MBE), hydride vapor phase epitaxy (HVPE), and the like may be used.

The nucleation layer 20 may then be formed on the silicon semiconductor substrate 10 (step S1). First, an Al coating process using a trimethylaluminum (TMAl) source may be performed at the temperature of the thermal cleaning process to form an Al coating layer on an upper surface of the silicon semiconductor substrate 10. The Al coating layer may prevent reaction between Si atoms on the upper surface of the silicon semiconductor substrate 10 and N atoms of NH3 as a source gas in a subsequent process of forming an AlN layer in formation of the nucleation layer 20. After formation of the Al coating layer is completed, reaction between the Al coating layer and NH3 may occur by passing NH3 over the upper surface of the silicon semiconductor substrate 10 at a temperature between 1000 and 1200° C. under a hydrogen atmosphere to form an AlN layer, thereby completing formation of the nucleation layer 20. The nucleation layer 20 may be formed under the same temperature conditions as those used when forming the Al coating layer.

The nucleation layer 20 may prevent Ga atoms included in a nitride semiconductor formed in a subsequent process from permeating into the silicon substrate 10 due to a melt-back phenomenon.

Next, the buffer layer 30 may be formed using AlGaN (step S2). As described above, the Al composition ratio may vary. The buffer layer 30 may alleviate stress occurring due to differences in coefficient of thermal expansion between a nitride semiconductor thin film formed in a subsequent process and the silicon semiconductor substrate 10.

The first semiconductor layer 40 may be formed on the buffer layer 30 using raw materials, i.e., trimethylgallium (TMGa) and NH3 (step S3). The first semiconductor layer 40 may be formed of GaN.

In certain embodiments, the first semiconductor layer 40 may be formed close to the silicon semiconductor substrate 10 formed therebelow. Thus if the thickness of the first semiconductor layer 40 is not appropriately adjusted, of Ga atoms included in the first semiconductor layer 40 may permeate into the silicon semiconductor substrate 10 due to the melt-back phenomenon. Thus, the first semiconductor layer 40 may be formed with a thickness sufficient to avoid permeation of the Ga atoms into the silicon semiconductor substrate 10.

After formation of the first semiconductor layer 40, the stress control structure 50 including the stress compensation layer 51 and the third semiconductor layer 52 may be formed (step S4). For this operation, first, an AlN layer may be formed as the stress compensation layer 51 by passing TMAl and NH3 over the upper surface of the first semiconductor layer 40 at a temperature between 700° C. and 1100° C. under a hydrogen atmosphere. The stress compensation layer 51 may alleviate stress occurring due to lattice constant mismatch and differences in coefficient of thermal expansion between the silicon substrate 10 and a GaN thin film in a subsequent process of forming the GaN thin film as the third semiconductor layers 52. A thickness of the stress compensation layer 51 may be established taking this function into consideration. The third semiconductor layer 52 may be formed on the stress compensation layer 51 using Si-doped GaN and then growth of the stress compensation layer 51 and the third semiconductor layer 52 may be repeated to achieve a desired thickness of the finally obtained GaN layer and a desired Si doping concentration.

For growth of n-type GaN, the second semiconductor layer 53 having a desired Si doping concentration may be formed (step S10).

As described above, the doping concentration of the third semiconductor layer 52 may be set lower than that of the second semiconductor layer 53. A detailed description of such doping concentration has been described above.

Hereinafter, a process of manufacturing a vertical type light emitting device using the hetero-substrate 100 will be described.

The second semiconductor layer 53 may act as the n-type semiconductor layer 200 of the light emitting device and, as desired, the n-type semiconductor layer 200 may further be formed on the second semiconductor layer 53.

Figure 10:
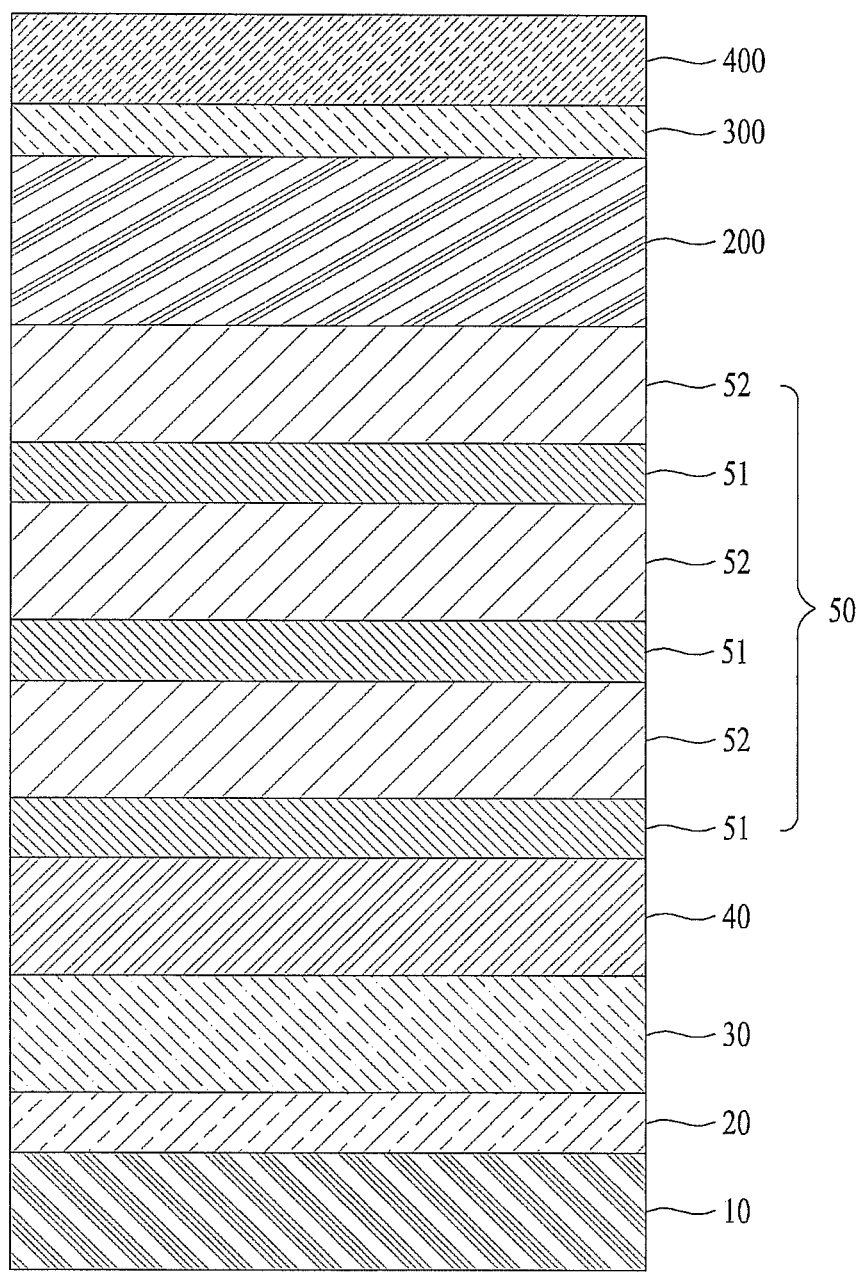
FIG. 10 is a sectional view of light emitting device disposed on a hetero-substrate, in accordance with embodiments as broadly described herein.

As illustrated in FIG. 10, an active layer 300 may be formed on the second semiconductor layers 53 and 200 (step S20). The active layer 300 may have a multiple quantum well structure and may be formed of a semiconductor based on a nitride such as indium gallium nitride (InGaN), GaN, aluminum indium gallium nitride (AlInGaN), or the like.

Subsequently, a fourth semiconductor layer 400 may be formed on the active layer 300 (step S30). The fourth semiconductor layer 400 may be formed using a nitride semiconductor such as a p-type GaN semiconductor. Hereinafter, a p-type semiconductor layer will be described as the fourth semiconductor layer 400.

Figure 11:
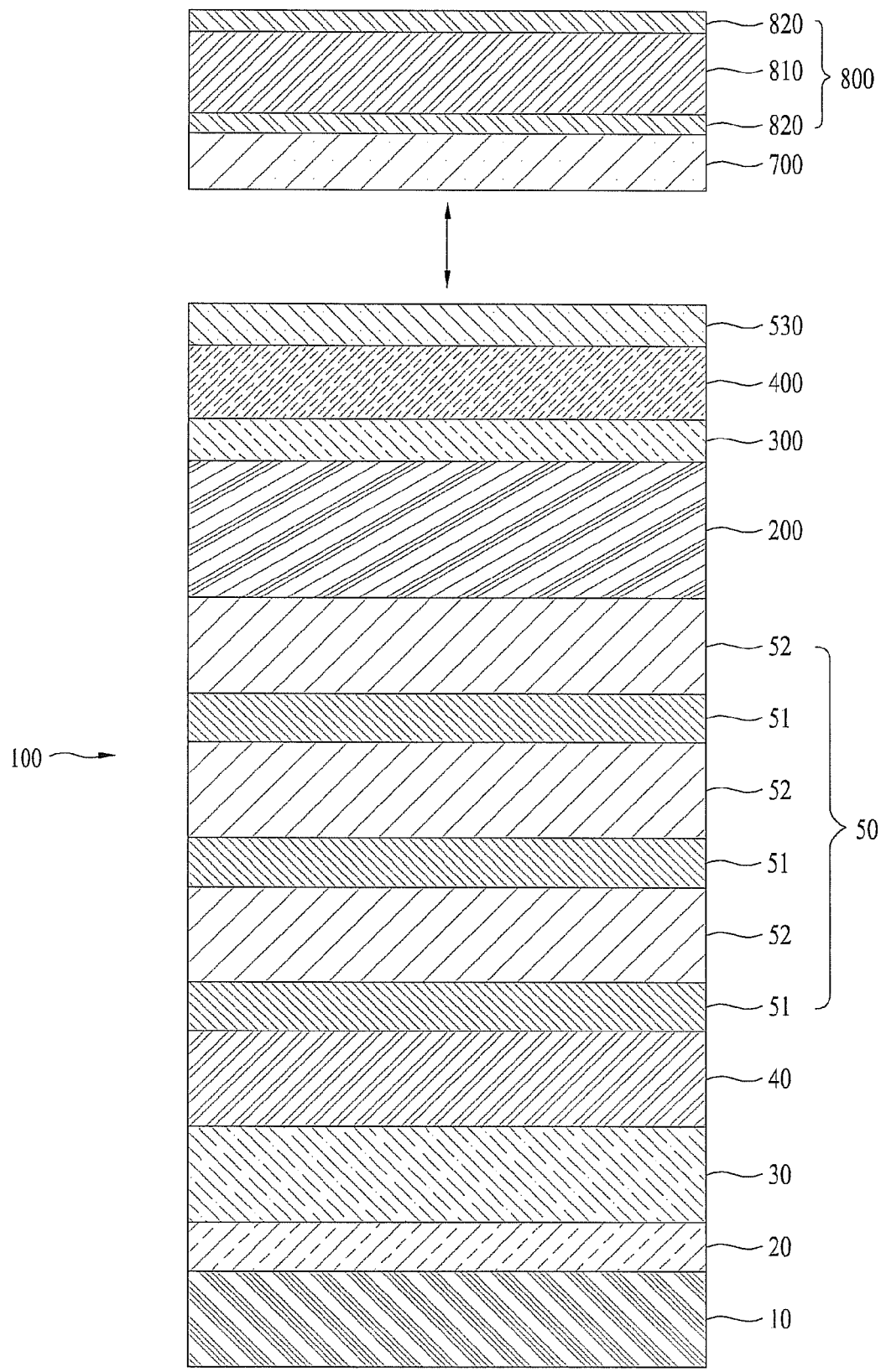
FIG. 11 is a sectional view of an attachment of a conductive support layer.

As shown in FIG. 11, a first electrode 530 may be formed on the p-type semiconductor layer 400 (step S40). The first electrode 530 may be a p-type electrode and may also act as a reflective layer.

Next, a conductive support layer 800 may be adhered using an adhesive metal layer 700 (step S50). The conductive support layer 800 may support a stacked structure in a subsequent process of removing the substrate 10 and may form a supporting structure of the light emitting device.

The conductive support layer 800 may have a structure in which an ohmic electrode 820 is formed on opposite surfaces of a semiconductor substrate 810. In some cases, a metal support layer may be used as the conductive support layer 800.

Next, the silicon semiconductor substrate 10 may be removed (step S60). Removal of the silicon semiconductor substrate 10 may be performed using a chemical method such as etching.

Figure 12:
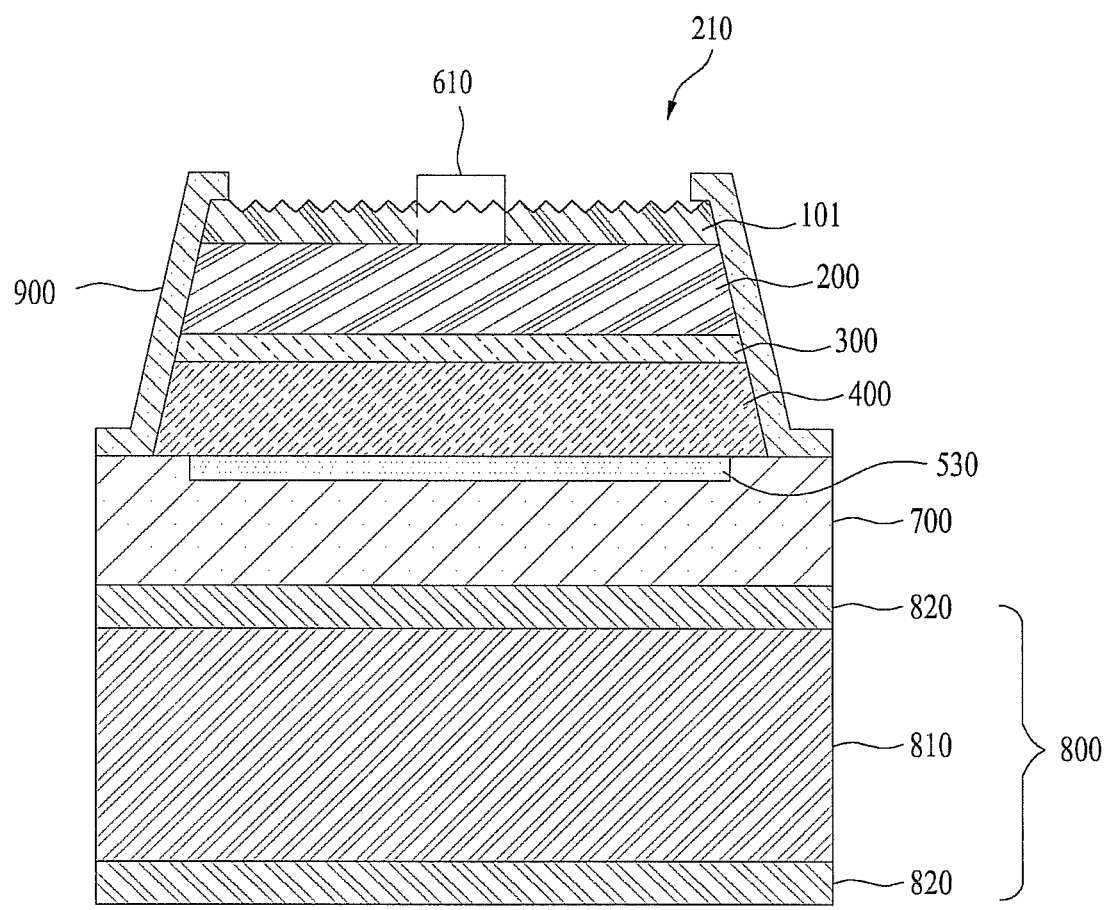
FIG. 12 is a sectional view of a vertical type light emitting device manufactured using a hetero-substrate, according to an embodiment as broadly described herein.

Subsequently, a light extraction structure 210 as shown in FIG. 12 may be formed (step S70). In this regard, at least a portion of the hetero-substrate 100 from which the silicon semiconductor substrate 10 has been removed may be used to form the light extraction structure 210.

For example, after removal of the silicon semiconductor substrate 10, portions of the nucleation layer 20 and the buffer layer 30 may be removed and the remaining portion may be used to form the light extraction structure 210.

Since the thickness of the n-type semiconductor layer 200 formed on the hetero-substrate 100 including the silicon semiconductor substrate 10 is relatively small, at least a portion of the hetero-substrate 101 may be used to form the light extraction structure 210.

In some cases, the light extraction structure 210 may also be formed after removal of the buffer layer 30 or the first semiconductor layer 40.

The light extraction structure 210 may be formed using a method such as etching.

Subsequently, after a process such as trench etching for formation of a region for separating individual light emitting devices is performed, a process of forming passivation layers 900 on side surfaces of the exposed semiconductor structure of the light emitting device may further be performed.

Next, a second electrode 610 electrically connected to the n-type semiconductor layer 200 (or the semiconductor layer 53) may be formed (step S80).

When the portion of the hetero-substrate 100 at which the light extraction structure 210 is formed has a lower conductivity than that of the n-type semiconductor layer 200, etching may be performed so as to expose a portion of the n-type semiconductor layer 200 and then the second electrode 610 may be formed on the exposed portion thereof.

A structure of the vertical type light emitting device manufactured through the above-described processes is shown in FIG. 12. In addition, a horizontal type light emitting device may also be manufactured using the hetero-substrate 100.

It will be apparent to those skilled in the art that various modifications and variations may be made to the disclosed embodiments without departing from the spirit or scope as broadly described herein. Thus, it is intended that embodiments as broadly described herein include such modifications and variations.

A hetero-substrate, a nitride-based semiconductor light emitting device, and a method of manufacturing the same are provided.

A hetero-substrate, a nitride-based semiconductor light emitting device, and a method of manufacturing the same are provided, in which the hetero-substrate is fabricated using a silicon semiconductor and thus occurrence of cracks by stress may be minimized and the hetero-substrate may have an appropriate thickness and conductivity.

A hetero-substrate as embodied and broadly described herein may include a substrate including a silicon semiconductor, a buffer layer disposed on the substrate, a first semiconductor layer disposed on the buffer layer and including a nitride semiconductor, a second semiconductor layer disposed on the first semiconductor layer and including a first conductive type nitride semiconductor having a first doping concentration, and a stress control structure disposed between the first semiconductor layer and the second semiconductor layer and including at least one stress compensation layer and at least one third semiconductor layer including a first conductive type nitride semiconductor having a second doping concentration that is the same or lower than the first doping concentration.

A method of manufacturing a nitride-based semiconductor light emitting device, as embodied and broadly described herein, may include forming a nucleation layer on a silicon semiconductor substrate, forming a buffer layer on the nucleation layer, forming a first semiconductor layer including a nitride semiconductor on the buffer layer, forming a stress control structure including at least one stress compensation layer and at least one second semiconductor layer including a first conductive type nitride semiconductor having a first doping concentration, on the first semiconductor layer, forming, on the stress control structure, a third semiconductor layer including a first conductive type nitride semiconductor having a second doping concentration that is greater than the first doping concentration, forming an active layer on the third semiconductor layer, and forming a fourth semiconductor layer including a second conductive type nitride semiconductor on the active layer.

A nitride-based semiconductor light emitting device as embodied and broadly described herein may include a conductive support layer, an adhesive metal layer disposed on the conductive support layer, a first electrode disposed on the adhesive metal layer, a first semiconductor layer disposed on the first electrode and including a first conductive type nitride semiconductor, an active layer disposed on the first semiconductor layer, a second semiconductor layer disposed on the active layer and including a second conductive type nitride semiconductor having a first doping concentration, a stress control structure disposed on the second semiconductor layer and including at least one stress compensation layer and at least one third semiconductor layer including a nitride semiconductor having a second doping concentration that is lower than the first doping concentration, and a light extraction structure formed at least a portion of the stress control structure.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A hetero-substrate comprising:
a silicon substrate;
a buffer layer provided on the silicon substrate;
a nucleation layer between the silicon substrate and the buffer layer, wherein the nucleation layer is formed by using an Al coating layer on the silicon substrate;
a first semiconductor layer provided on the buffer layer, the first semiconductor layer comprising a nitride semiconductor;
a second semiconductor layer provided on the first semiconductor layer, the second semiconductor layer comprising a first conductive type nitride semiconductor having a first doping concentration between $5\times10^{18}$ atoms/cm$^3$ and $2\times10^{19}$ atoms/cm$^3$; and
a stress control structure provided between the first semiconductor layer and the second semiconductor layer, the stress control structure comprising a plurality of stress compensation layers and a plurality of third semiconductor layers that are alternately arranged with respect to each other, the third semiconductor layer comprising the first conductive type nitride semiconductor having a second doping concentration that is less than or equal to the first doping concentration,
wherein respective second doping concentrations of the plurality of third semiconductor layers increase, from 15% to 90% of the first doping concentration between $5\times10^{18}$ atoms/cm$^3$ and $2\times10^{19}$ atoms/cm$^3$, as the respective third semiconductor layer is provided closer towards the second semiconductor layer,
wherein at least one stress compensation layer is provided between the third semiconductor layers and the second semiconductor layer, and
wherein the first semiconductor layer is doped and has a lower doping concentration than that of the third semiconductor layer.

2. The hetero-substrate of claim 1, wherein the stress compensation layer comprises an AlN layer, and the third semiconductor layer comprises a GaN layer.

3. The hetero-substrate of claim 1, wherein a thickness of the stress compensation layer is approximately 10 nm to 100 nm.

4. The hetero-substrate of claim 1, wherein the silicon substrate has a (111) crystal plane.

5. The hetero-substrate of claim 1, wherein the buffer layer comprises AlN or AlGaN.

6. The hetero-substrate of claim 5, wherein an Al composition of the buffer layer decreases as distance from the silicon substrate increases.

7. The hetero-substrate of claim 1, wherein the second semiconductor layer has a thickness of between 0.5 μm and 5 μm.

8. The hetero-substrate of claim 1, wherein the second semiconductor layer is a nitride semiconductor layer of the first conductivity type of a light emitting device or is configured to form a nitride semiconductor layer of the first conductivity type of a light emitting device.

9. The hetero-substrate of claim 1, wherein the nucleation layer prevents Ga atoms included in a GaN layer from permeating into the silicon substrate.

10. The hetero-substrate of claim 1, wherein the respective doping concentrations is configured to prevent occurrence of cracks in the second semiconductor layer.

11. The hetero-substrate of claim 6, wherein the Al composition of the buffer layer is between 0.2 and 0.6.

12. The hetero-substrate of claim 1, wherein the third semiconductor layer has a thickness between 30 nm and 1.5 μm.

13. The hetero-substrate of claim 1, wherein the Al coating layer is formed to prevent reaction between Si atoms in the silicon substrate and N atoms in the nucleation layer.

14. The hetero-substrate of claim 1, wherein the first semiconductor layer has a lower doping concentration of $3\times10^{18}$ atoms/cm$^3$ or less.

* * * * *